(12) United States Patent
Bartos et al.

(10) Patent No.: US 9,176,207 B2
(45) Date of Patent: Nov. 3, 2015

(54) METHOD FOR PRODUCING AN ELECTRICAL COMPONENT AND ELECTRICAL COMPONENT

(75) Inventors: Axel Bartos, Waltrop (DE); Andreas Voss, Dortmund (DE)

(73) Assignee: MEAS DEUTSCHLAND GMBH, Dortmund (DE)

( * ) Notice: Subject to any disclaimer, the term of this patent is extended or adjusted under 35 U.S.C. 154(b) by 600 days.

(21) Appl. No.: 13/496,153

(22) PCT Filed: Sep. 14, 2010

(86) PCT No.: PCT/EP2010/005620
§ 371 (c)(1),
(2), (4) Date: Mar. 14, 2012

(87) PCT Pub. No.: WO2011/029629
PCT Pub. Date: Mar. 17, 2011

(65) Prior Publication Data
US 2012/0168222 A1 Jul. 5, 2012

(30) Foreign Application Priority Data
Sep. 14, 2009 (DE) .......................... 10 2009 041 096

(51) Int. Cl.
*G01R 33/12* (2006.01)
*B82Y 25/00* (2011.01)
*H01F 41/16* (2006.01)
*H01F 1/00* (2006.01)

(52) U.S. Cl.
CPC ............. *G01R 33/1269* (2013.01); *B82Y 25/00* (2013.01); *H01F 1/0054* (2013.01); *H01F 41/16* (2013.01)

(58) Field of Classification Search
CPC .... G01R 33/09; G01R 33/093; G01R 33/096; G01R 33/098
USPC ............... 427/96.1, 96.2, 97.1, 97.3; 324/260
See application file for complete search history.

(56) References Cited

U.S. PATENT DOCUMENTS 6,524,697 B1 * 2/2003 Furuyama et al. ............ 428/328
7,847,542 B2 12/2010 Bartos et al.
(Continued)

FOREIGN PATENT DOCUMENTS

| | | | |
|---|---|---|---|
| JP | 2004014948 A | 1/2004 | |
| JP | 2007116159 A | 5/2007 | |

(Continued)

OTHER PUBLICATIONS

Chinese Office Action dated May 16, 2013 for related Chinese Application No. 201080035097.X.
English Translation of Chinese Office Action dated May 16, 2013 for related Chinese Application No. 201080035097.X.
(Continued)

*Primary Examiner* — Gerard Higgins
(74) *Attorney, Agent, or Firm* — Howard IP Law Group, PC

(57) ABSTRACT

A method for producing an electrical component which includes at least two electrical contacts and nanoparticles which are arranged on a substrate and which are made of an electrically conductive material, nanoparticles made of a magnetic material and/or nanoparticles made of a magnetisable material, an ink containing the nanoparticles and/or nanoparticles surrounded by a cover, wherein the nanoparticles are deposited on the substrate according to a printing method.

13 Claims, 11 Drawing Sheets

(56) References Cited

U.S. PATENT DOCUMENTS

Figure 1:
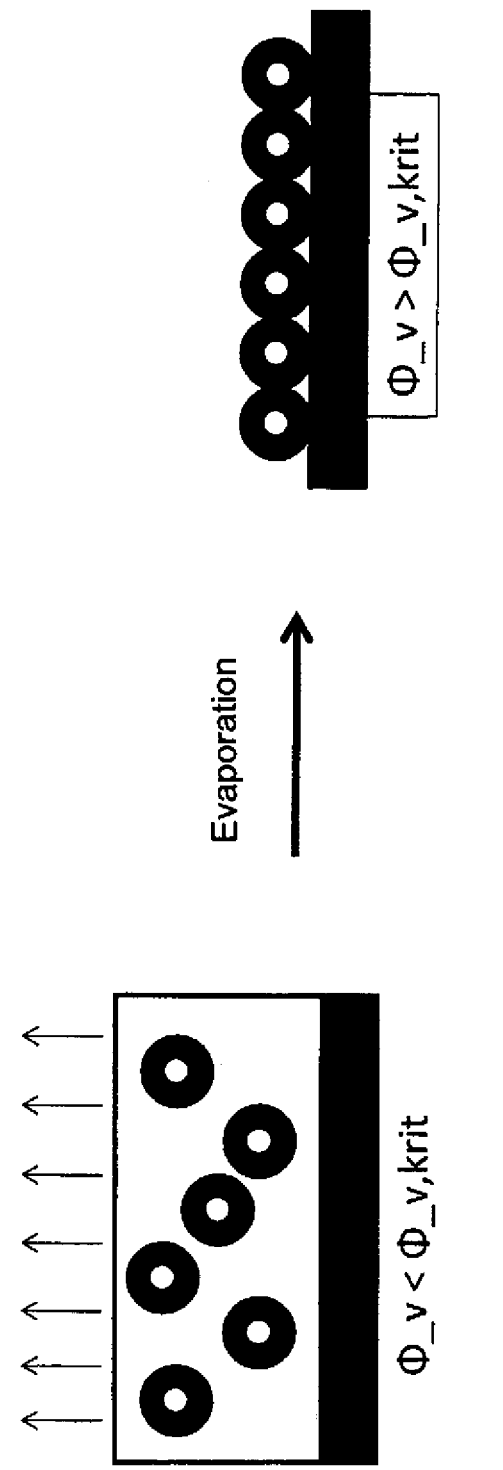

| | | |
|---|---|---|
| 2007/0080683 A1 | 4/2007 | Bartos et al. |
| 2008/0191694 A1 | 8/2008 | Barton et al. |
| 2009/0001983 A1* | 1/2009 | Wittkowski .................. 324/260 |
| 2010/0141244 A1 | 6/2010 | Bartos et al. |

FOREIGN PATENT DOCUMENTS

| | | |
|---|---|---|
| JP | 2010012714 A | 1/2010 |
| WO | WO 2007/044959 | 4/2007 |
| WO | 2007060784 A1 | 5/2007 |

OTHER PUBLICATIONS

W.F. Puntes, K.M. Krishan and P. Alivisatos, Collodial Nanocrystal Shape and Size Control: The Case of Cobalt, Science vol. 291 No. 5511, (Mar. 16, 2001), 9 pages.

Inga Ennen: "Charakterisierung von Cobalt-Nanopartikeln und Untersuchungen zur Herstellung granularer Strukturen", University of Bielefeld, Oct. 31, 2003.

Inga Ennen: Magnetische Nanopartikel als Bausteine für granulare Systeme: Mikrostruktur, Magnetismus und Transporteigenschaften, University of Bielefeld, 2008.

* cited by examiner

METHOD FOR PRODUCING AN ELECTRICAL COMPONENT AND ELECTRICAL COMPONENT

The invention relates to a method for the production of an electrical component having at least two electrical contacts and nanoparticles made from an electrically conducting material and/or nanoparticles made from a magnetizable material arranged on a substrate. The invention also relates to an electrical component.

From the diploma thesis "Characterization of cobalt-nanoparticles and study for the manufacture of granular structures" of Inga Ennen, prepared 2003 for the faculty for physics of the university of Bielefeld, and the dissertation "Magnetic nanoparticles as components for granular systems: micro structure, magnetism and transport properties" of Inga Ennen, prepared 2008 for the faculty of physics of the university of Bielefeld, it is known to form nanoparticles by nucleus formation, growth, ripening and stabilization (chapter 2.1 of the dissertation). Further, it is known to use Co-nanoparticles with a mean diameter of 8 nm for creating a granular model system, and to transfer these to a substrate by means of dipping or spin coating as well as to cover the magnetic particle nuclei with a thin metal layer after removal of an organic cover of the nanoparticles (cf. chapter 7.1 of the dissertation, and the further cross references to the dissertation and the diploma thesis contained therein). A particular disadvantage of this approach is that the particle mono layer is generated by means of spin coating or dipping. These methods are not appropriate for an industrial production of electrical components.

Given this background, the invention is based on the object to propose a production method for the electrical component described at the beginning, which allows an industrial manufacture of such electrical components. Further proposed is a versatile electrical component.

This object is solved by the production method according to claim 1 and the electrical component according to claim 12. Advantageous embodiments are set forth in the sub claims and in the following description.

The invention is based on the fundamental idea to place the nanoparticles and/or nanoparticles which are surrounded by a cover, in a fluid, thus creating an ink, which can be deposited on the substrate by means of a printing process. Printing processes, i.e. processes in which an ink is deposited on a substrate, are well known from other technical fields, in particular from the printing on paper and textiles and, with regard to their technology, are sufficiently sophisticated to deposit an ink on a substrate on an industrial scale.

Particularly preferably, the ink jet printing method, which belongs to the Non Impact Printing (NIP-methods, electronic printing methods without explicit printing form) and is well known from office technology, is used as printing process.

However, methods which operate according to the planographic, relief, gravure or screen printing, as defined in DIN 16500, can also be used as printing methods. In the relief printing method the image areas of the printing plate are elevated relative to the non-image areas (for example known from book printing, Flexo printing). In the planographic printing method the image areas and the non-image areas of the printing plate are approximately in the same plane (for example known from offset printing). In the relief printing method the image areas of the printing plate are positioned lower than non-image areas. In the screen printing method the image areas of the printing plate consist of a template on a template carrier (sieve made from plastic or metal strings), which is permeable to dye, non-image areas are not permeable to dye (for example known from sieve printing and risography). Particularly preferably, direct printing methods are used, which are defined by the fact that the printed image is transferred from the printing plate directly onto the substrate. Therefore, the printed image has to be arranged in a mirror inverted manner on the printing plate. Examples of a direct printing method are Rakel gravure printing, book printing and Flexo printing. However, it is also possible to use indirect printing methods, which are defined by the fact that the printed image is first transferred onto an intermediate carrier. The intermediate carrier is flexible and releases the dye further onto the substrate. Therefore, in the indirect printing method, the printed image has to be right reading. Examples of an indirect printing method are offset printing and tampon printing. Tampon printing also relates to a printing method in which the ink is taken up with the felt tip of a (inkless) felt tip pen by dipping the felt tip into the ink for taking up the ink, and, by pressing the felt tip onto the substrate for releasing the ink, the ink is released. The tampon printing method also relates to a printing method in which an ink filled felt tip pen, is pressed with its felt tip onto the substrate for releasing the ink and optionally moved along the surface of the substrate while being pressed down. The laser printing method can also be used, in which partial areas of a roller are charged by means of a laser, the roller is passed by an oppositely charged toner, and because of the difference in charge, takes up particles of the toner, to be then placed onto a paper when the roller is passed by the paper. A wax ink printing method can also be used in which the particles are enclosed in a wax, which is melted in a drop by drop manner such that the drops drop onto a roller and are deposited onto the paper by the roller. Among the possible methods described before, which operate according the planographic, relief, gravure, or screen printing method, methods are particularly preferably used in which the ink is not heated to a temperature of above 400° C.

The ink jet printing method, which is especially preferably used, relates to a matrix printing method, in which a printed image is created by targeted shooting off or deflecting of small ink droplets. The printing method can be carried out as single or multiple jet method, wherein in the multiple jet method more droplets are shot off per unit of time, namely in parallel "jets". In both cases (single or multiple jet) the ink jet exits from the ink head via a nozzle. In a preferred embodiment, this jet can be modulated via a piezoelectric converter which is positioned behind the nozzle, such that an even break up into individual drops (Raleigh's drop break up) is achieved. In a preferred embodiment, the thus formed drops can be charged electrostatically to a higher or lower degree. The 10 to 40 m/s fast drops then fly through a larger deflection electrode, where they are deflected laterally, depending on their specific electrical charge. The charged or uncharged drops respectively, depending on the type of device, now reach the substrate. Unneeded drops can be captured already at the printing head and fed back into the ink circuit. The print jet method can be operated as binary-deflecting method and multi-defecting method. In the former, the drop either reaches the substrate or is deflected into a drop catcher. In the multi-deflecting method the drops can be deflected differently based on different charge states. This allows printing of a broader line via one nozzle. The width of the line depends on the distance of the nozzle to the substrate, whereby a greater distance reduces the resolution.

As an alternative to the embodiment with charge electrode, the particularly preferred ink jet printing method can also be configured without charge electrode. In this case, the formed drops are conducted to the paper by means of a channel provided in the printing head. At the exit of the channel the formed drops exit and are deposited on the paper.

Use of the ink jet printing method offers the advantage that the formation and propagation of the ink in the printing head occurs via deformation based pressure and thus the temperature in the printing head and with that in the ink corresponds essentially to the room temperature, or least does not exceed 400° C. This allows to avoid that—should nanoparticles be present in the ink which perform such a phase jump—a phase jump from HCP (hexagonal closest packed structure) to FCC (face centered cubic structure) already occurs in the ink. In an alternative embodiment, a printing method can be used in which the temperature in the printing head and with that in the ink essentially exceeds 400° C. This allows—should nanoparticles be present in the ink which perform a phase jump—a phase jump from HCP (hexagonal closest packed structure) to FCC (face centered cubic structure) to already occur in the ink. In an alternative embodiment it is further, possible that nanoparticles, which have a FCC are already present in the ink before carrying out the printing process.

Particularly preferably, a printing method is used, in which droplets are created, or in which toner particles are used respectively, which are deposited on the substrate as in the particularly preferred ink jet method for example droplets are created which are "shot off" by the printing head. Particularly preferably, printing methods are used which generate droplets, or toner particles are used, respectively, which have an average droplet content of less than 500 picoliters, particularly preferably of less than 100 picoliters, particularly preferably of less than 50 picoliters, especially preferably of less than 10 picoliters and preferably of about 1.5 picoliters. The smaller the droplet content, the higher is the resolution of the "image" generated with the printing method, i.e. the arrangement of the ink on the substrate.

In a preferred embodiment the printing method is carried out with a dispenser, or micro dispenser, respectively, preferably with a printer without magnetic and/or metallic components. Magnetic or metallic components can for example influence the distribution of the nanoparticles in the ink. Particularly preferably, a printer is used, in which at least those components which come into contact with the ink are not magnetic or metallic components, while components which do not come into contact with the ink can be magnetic or metallic. Preferably, the printer is EMF shielded, i.e. it has a shielding against electromagnetic fields (EMF).

In a preferred embodiment the ink is mixed before deposition on the substrate. Preferably, this can lead to an even distribution of the nanoparticles in the ink. For example, the ink can be stored in a reservoir and mixed in the reservoir, for example by shaking the reservoir or by static and/or moving mixing elements which are immersed into the reservoir. The ink can also be mixed for example when being withdrawn from the reservoir, for example by immersing an aspirating device into the ink in the reservoir for withdrawing the ink from the reservoir, with the immersion occurring abruptly. The ink can also be mixed in conduits—if available—of the printing device, for example by shaking these conduits or by conducting the ink past static and/or moving mixing elements provided in the conduits. Also, ultrasound heads can be provided which propagate ultra sound waves into the ink and thereby mix the ink. A mixing can also occur by taking up a partial amount of the ink into a pipette by aspiration into the pipette and subsequently expelling the ink. By entering of the fluid jet, which is produced by the expulsion, into the remaining ink, the remaining ink can be mixed.

In a preferred embodiment an ink reservoir—if present—is protected from environmental influences, in particular from oxygen. This allows to avoid oxidation of metallic nanoparticles. In a preferred embodiment a protective-gas device can be provided for an ink reservoir. This can essentially be a box with membranes, which can be perforated by the printing head to reach the inside of the reservoir and to aspirate the ink therein. The box can be filled with protective gas, for example nitrogen, and can have a slight overpressure relative to the environment, such that protective gas can exit through the membrane but no oxygen can enter the protective gas device.

In alternative embodiments the following printing methods can be used: Scher-Jet, continuous-jet, MEMS-valve, thermic actuators (bubble jet) and roll-on-roll printing.

The nanoparticles which are to be arranged on the substrate, are made from an electrically conductive material, nanoparticles from a magnetic material and/or nanoparticles from a magnetizable material. Beside the nanoparticles made from an electrically conductive material, the nanoparticles made from a magnetic material and/or nanoparticles made from a magnetizable material, nanoparticles made from non-conducting material can also be used, for example for providing an insulation between nanoparticles or for a passivation. Nanoparticles made from a magnetic material refer to such nanoparticles which already generate a magnetic field. Nanoparticles made from a magnetizable material relate to such nanoparticles which can be converted by further steps to generate a magnetic field themselves, for example by application of an external magnetic field. Super paramagnetic nanoparticles are also conceivable, which do not generate a magnetic field towards the outside but can, however, react to a magnetic field such as for example the TMR-effect (Tunneling Magneto-Restive Effect) at the border transition magnet/insulator.

Particularly preferably, the nanoparticles are made from cobalt (Co), samarium (Sm) iron (FE), ruthenium, neodym or other rare earths or alloys, which contain one or more of these elements such as for example iron/cobalt (FeCo)-alloys or cobalt/copper (CoCu)-alloys.

The nanoparticles contained in the ink, or nanoparticles surrounded with a cover, respectively, preferably have a mean diameter of less than 100 nm (in the case of nanoparticles surrounded by a cover this specification refers to the diameter of the nanoparticles themselves). Particularly preferably, the nanoparticles have a mean diameter of less than 50 nm, particularly preferably of less than 20 nm. In particular for electrical components which are intended to have a ferromagnetic effect, particles of a mean diameter of 15 nm are used, and for electrical components, which have a super paramagnetic effect, particles with a mean diameter of 6 nm are used.

The nanoparticles do not necessarily have to be spherical. They can for example be longitudinal (cigar shaped) or oval or elliptical. A "cigar shape" of the nanoparticles, allows an anisotropic arrangement of the particles. In a preferred embodiment, the nanoparticles are however, essentially spherical or oval or elliptical.

In a preferred embodiment the nanoparticles contained in the ink have an essentially same diameter, wherein in a preferred embodiment, the standard deviation (sigma) the nanoparticle diameter distribution is smaller than 10%, particularly preferably smaller than 5%. In such distributions of nanoparticle diameters self organization of the nanoparticles is established particularly well.

In a preferred embodiment the nanoparticles have an oxide cover, which itself is surrounded by a ligand cover. This stabilizes the nanoparticles against oxidation, such that a removal of the ligand cover in the ambient air is possible. In a preferred embodiment the oxide cover has an oxide thickness of 2 nm, particularly preferably of 1.5 nm and especially preferably of 1 nm.

In a preferred embodiment the ink can contain two or more different types of nanoparticles, for example as a first type, nanoparticles without a cover, and as a second type, nanoparticles with a cover or, for example, as a first type, nanoparticles made from a first material (for example made from a magnetic material or from a magnetizable material) and as second type, nanoparticles made from a second material (for example made from a non-magnetic, non-magnetizable, electrically conductive material). An ink with two or more different types of nanoparticles can be used to create a structure with different types of nanoparticles on the substrate in a single printing step. For example, for a possible way to create the GMR effect, first a nano particle plane can be created with an ink which contains only one type of nanoparticles, after which the ligands are removed and a new conducting plane is created with an ink which has conductive nanoparticles. Finally, a passivation plane is created with an ink with nanoparticles which have a passivating effect. For a possible way to create the TMR effect an ink with a mixture of nanoparticles can be used, for example super paramagnetic nanoparticles and gold particles, both with ligand cover. The nanoparticles of the mixture are preferably designed such that molecular bonds form which create a desired matrix arrangement of super paramagnetic particles to gold particles. The TMR effect occurs at the interface between super paramagnetic particles and nano particle-oxide layer. Gold serves as electrical contact between one another. The mixture ratio can for example be 1:1.

In a preferred embodiment the ink used in the manufacturing method according to the invention has a solvent in which the nanoparticles are dissolved. According to a preferred embodiment of the production method according to the invention, the solvent is evaporated after deposition of the ink on the substrate. Particularly preferably 1, 2 dichlorbenzol is used as solvent, and as stabilizer: trioctylphosphinoxide (TOPO), oleic acid, olamine, and/or linseed oil mixtures. Preferably, a compound is used which is volatile at ambient air, and which has a stabilizing effect on the nanoparticles under protective atmosphere, and thus prevents an agglomeration and sedimentation of the same. At ambient temperature an energy input through Braun's movement is possible.

The solvent of the ink is preferably chemically stable with regard to the material of the cover which surrounds the nanoparticles in an embodiment of the invention, and in particular stable with regard to the material of the nanoparticles.

Particularly preferably, the solvent has a low evaporation rate. 1, 2 dichlorbenzol can evaporate within a few minutes, wherein the evaporation rate depends on the amount and the relative surface (interface) to the ambient air. Evaporation within 2 to 5 min (manual handling possible) is desirable for the production process. However, it can also be desirable to evaporate faster (machine handling).

The ink is preferably withdrawn from a reservoir, which prevents a contact of the ink with oxygen. For example, the reservoir can be sealed airtight and/or arranged in a protective atmosphere (for example nitrogen). This allows to prevent oxidation of the nanoparticles. Also, mixing devices can be provided which mix the ink during storage in the reservoir.

In a preferred embodiment, an ink is used which contains nanoparticles which are surrounded by a cover. Surrounding the nanoparticles with a cover allows stabilizing the nanoparticles. Nanoparticles dissolved in the ink can have the tendency to form agglomerations or coagulates. These processes are counteracted in a preferred embodiment of the production method according to the invention. Possible ways for stabilization are charge stabilization, stabilization by polymers or steric stabilization. Particularly preferably, the steric stabilization is used within the context of the production method according to the invention. The charge stabilization occurs via the electrostatic repulsion of like charges. The charge stabilization occurs for example in silver halogenide particles. The stabilization by polymers, as for example PVP (polyvinylpyridin), can lead to a spatial separation of the particles based on the size of the polymer molecules. In the steric stabilization the separation of the nanoparticles occurs through a ligand cover, which separates the particles from one another and can protect them for example from oxidation. Ligands relate to amphiphile molecules which, with their hydrophile head group, form covalent or coordinate bonds with the particle nucleus (the nanoparticle) and the hydrophobic alkyl chains are oriented into the solvent. When using nanoparticles with a ligand cover, non-polar media are preferably used as solvents. The strength of the bond between head group and nucleus can influence the growth and the shape of the particles, whereas the length of the alkyl chain contributes to determining the interaction potential between particles.

In a preferred embodiment of the production method according to the invention the nanoparticles are created at least by the following method steps:
    creation of nuclei by reduction of metal salts or a disintegration of metal organic compounds in a solvent
    growth of the nuclei and
    Ostwald ripening process The creation of the nuclei of the nanoparticles, for example of the cobalt-nano particles or FeCo-nanoparticles occurs in particular via the thermolysis of metal organic trecusors in a binary tenside solution, as described for example in W. F. Puntes, K. M. Krishnan and P. Alivisatos, Science 291, 2115 (2001). For a detailed illustration of the production methods of the nanoparticles we refer to chapter 2.1 of the diploma thesis, or chapter 3.1 and 3.1.1 of the doctoral thesis respectively, of Ms Ennen. For the production of the nanoparticles, these chapters are incorporated by reference into this description of the production method according to the invention and thus are part of the description of the production method according to the invention.

In a preferred embodiment, the Ostwald-ripening process is followed by a stabilization of the nanoparticles, which were created during the Ostwald-ripening process, for example through creation of the ligand cover.

In a preferred embodiment the substrate comprises at least in parts, in particular essentially silicon oxide. As an alternative or in addition, the substrate can be a chip surface made, for example, from processed silicon and/or germanium. The substrate can also be, at least partially, made of a plastic or a ceramic or a glass. The substrate can be a circuit board of conventional type, or Flexprint. Structures can be integrated on the circuit board, which influence the deposition of the ink. These can be mechanical structures, such as channels, or special coatings on which the nanoparticles bind or—if desired—do not bind. Further structures are electrical circuits which, when supplied with current generate electrical and/or magnetic fields which influence the deposition characteristics. The substrate can be configured as a foil. The substrate can be an insulator. The substrate can have means which generate a magnetic field such that for example during deposition of the ink a magnetic field can be generated. The substrate can also have a platinum surface or be a processed chip surface. The substrate can be pretreated with a plasma, to bind as many nanoparticles as possible on the surface.

With the production method according to the invention, electrical components are produced which have at least two electrical contacts. These electrical contacts are preferably arranged on the same substrate on which the ink is deposited. In a first embodiment, the electrical contacts are already provided on or in the substrate, respectively. The ink can then for example be printed onto the electrical contacts or at least deposited such that it partially overlaps the contacts. The ink can also be deposited on the substrate at a distance to the electrical contacts after which an electrical connection between the contacts and the nanoparticles can be created for example by printing-on an electrically conductive material for example by printing on a second ink with nanoparticles made from a non-magnetic, electrically conducting material. The electrical contacts of the electrical component do not have to be provided on or in the substrate respectively, on which the ink is deposited. For example, in a second embodiment, the electrical contacts can also be deposited on the nanoparticles which are arranged on the substrate, in a subsequent step. Also this deposition of the contacts can be carried out for example by means of a printing method with a second ink with nanoparticles made from a non-magnetic, electrically conductive material.

It is advantageous for the electrical component which is produced with the production method according to the invention, when the nanoparticles are arranged evenly within the surface areas of the substrate in which they are to be arranged on the substrate (even lattice structure). This even lattice structure can either be established by taking advantage of structures that are already present (for example the substrate can have a surface structure, for example indentations, such that after printing, a nanoparticle is arranged in each indentation) or for example and particularly preferably by taking advantage of the self organization of the nanoparticles. For the purpose of this description of the invention, self organization refers to the transition from an unordered state of the particles in the ink to a periodical arrangement on the substrate as shown in FIG. 1. For a detailed description of the self organization and the parameters that influence it, we refer to chapter 2.2 of the doctoral thesis of Ms Dr. Inga Ennen (magnetic nanoparticles as building blocks for granular systems: microstructure, magnetism and transport properties"), chapter 2.2 of which we incorporate fully into this deposition by reference with regard to establishment of the self organization and chapter 2.2 of which shall be deemed a part of this description of the invention with regard to the establishment of the self organization.

In a preferred embodiment, the volume fraction of the particles in the solution is larger than 49% such that the solvent and other elements which might be present in the ink take up a volume fraction of less than 51%. Self organization of the particles on the substrate has proven to occur particularly easily at or above a volume fraction of 49%. To support the self organization of the particles, it is advantageous to wet the substrate with the ink evenly, keep the nanoparticle distribution particularly small and, if applicable, let the solvent evaporate slowly.

In a preferred embodiment, an external magnetic field is deposited during the deposition of the ink and/or during the removal of the liquid of the ink. This external magnetic field can influence the arrangement of the nanoparticles and thus lead to a desired arrangement of the nanoparticles on the substrate. For example, in the case of magnetic nanoparticles, the deposition of a magnetic field can cause the nanoparticles to orient themselves in a particular direction.

In a preferred embodiment of the production method according to the invention an ink is used which, at least partially, has nanoparticles which are surrounded by a cover, and wherein according to this preferred embodiment in the case of such an ink the cover which surrounds the nano particle is removed after deposition on the substrate. The removal of the cover can for example occur by means of heat. As an alternative, when using an ink which has nanoparticles which are surrounded by a cover, removal of this cover can be omitted.

In a preferred embodiment of the production method according to the invention an electrically conductive material is deposited, which contains at least one nano particle with an electrical contact. The deposition of the electrically conductive material can also occur by printing-on. The electrically conductive material can be deposited simultaneously with the ink for example in that a first nozzle of a printing head applies an ink with a first type of nanoparticles for example made from magnetic or magnetizable material, and a second nozzle of the printing head applies an ink with a second type of nano particle for example made from non-magnetic, electrically conductive material. The electrically conductive material can also be deposited in a method step after deposition of the ink. The electrically conductive material can however, also be deposited in such a way that, on the one hand, it connects a plurality of nanoparticles to one another, and on the other hand to the electrical contact. The electrically conductive material can for example be gold or silver, carbon nanotubes, copper for example, if copper is already used as a conducting track, or conducting polymers. The electrically conductive material can also be deposited in another form and does not have to be deposited by means of a printing method. For example, the electrically conducting material can be deposited by means of soldering methods, via bond wires or ion beam implantation.

In a preferred embodiment of the method according to the invention an electrically conductive material is deposited, which connects at least one nanoparticle which is deposited on the substrate with a second nanoparticle deposited on the substrate. The electrical component can for example be constructed in such a way that a nanoparticle contacts an electrically conducting contact located on or in the substrate. By depositing an electrically conducting material which connects this (first) nanoparticle to a further (second) nanoparticle, the further (second) nanoparticle can also be conductively connected to the contact. The deposition of the electrically conducting material can—if a plurality of nanoparticles were deposited on the substrate—occur selectively in such a way that only some nanoparticles of the plurality of the nanoparticles are connected to one another, and other nanoparticles not connected to one another at all (so called percolation theory). Through deposition of the conducting material, conducting tracks can be formed, wherein a conducting track conductively connects a first group of nanoparticles to each other, which have been deposited on the substrate, while a second conducting track connects a second group of nanoparticles to each other which have been deposited on the substrate, without the electrically conducting material of the first conducting track contacting the electrically conducting material of the second conducting track.

In a preferred embodiment of the production method according to the invention a second layer, for example a protective layer, is deposited on at least one nanoparticle after deposition of the nanoparticle. The additional layer can serve as an insulator. The additional layer can also serve as protective layer for example as protection against oxidation or as protection against mechanical influences. The protective layer can be made from polymers, for example from PMMA (polymethyl methacrylate), from PVC (polyvinylchloride) or from polystyrene.

In a preferred embodiment the nanoparticles are treated with heat during the printing process and/or after deposition on the substrate. This heat input can, on the one hand, have the purpose to remove a cover around the nanoparticles which is provided in certain embodiments of the invention and/or to evaporate the liquid in the ink. However, the heat input can also have the purpose to influence the magnetic properties of the nanoparticles for example, to cause the transition from super paramagnetic properties to ferromagnetic properties. This can be achieved for example by heating the particles to above 400° C. The heat input in particular the heat input for changing the magnetic properties of the, or individual, deposited nanoparticles, can occur for example by means of a laser. A laser has a certain output power. A defined energy input can occur in a targeted manner via pulses and the number of the pulses, as well as their duration. This can be used in particular to achieve the transition from hcp to fcc at defined positions. Likewise, with broad apertures (i.e. an optic which broadens the laser beam) whole areas and not only small points can also be transformed without significantly disturbing neighboring areas. A of heat input, which only serves to remove the cover around the nanoparticles, which is provided in certain embodiments, and/or to evaporate the liquid in the ink is carried out particularly preferably at temperatures of less than 400° C., for example in an oven. In a preferred embodiment, the nanoparticles can, in addition or as an alternative, be treated with high frequency irradiation or with microwaves, during the printing process and/or after deposition on the substrate.

In a preferred embodiment only some of the nanoparticles which have been deposited onto the substrate are treated with heat. This can serve to change the magnetic properties only of some nanoparticles. In this way for example a bias-magnet can be created on the substrate. The field direction of the bias magnet can be adjusted by applying an external magnetic field to the nanoparticles during the heat treatment. Conducting lines which have been embedded previously can also be supplied with current during heat treatment and thus a defined magnetic field can be generated.

A heat input provided in a preferred embodiment during printing of the ink, in particular a heat treatment of the ink while it is positioned between a printing head and the substrate, can lead to a phase transition on the way from the nozzle to the substrate.

In a preferred embodiment of the production method according to the invention at least two consecutive printing steps are carried out. In a first printing step the ink which contains the nanoparticles and/or nanoparticles surrounded by a cover, can be deposited on the substrate, which nanoparticles can be made from a magnetic or magnetizable material, and in a second printing step an ink with nanoparticles made from a non-magnetic, electrically conductive material. In a printing step a protective layer can also be deposited on some or all nanoparticles. Also, several layers of nanoparticles can be deposited in several printing steps. Also, a first layer of nanoparticles (for example made from a magnetic or magnetizable material) can be deposited by a first printing step, an intermediate layer (for example comprising nanoparticles made from a different material for example plastic) by a second printing step, and a second layer of nanoparticles (for example made from a magnetic or magnetizable material), which for example correspond to the nanoparticles of the first layer, in a third printing step. The intermediate layer can also be deposited by a different deposition process.

Example A 1. layer of nanoparticles made from cobalt (Co), samarium (Sm), Iron (Fe) or from alloys, which contain one or more of these elements, such as for example iron/cobalt (FeCo)-alloys or cobalt/copper (Co/Cu)-alloys.
2. layer: electrically conductive layer, which connects at least some of the nanoparticles of the 1. Layer electrically conducting with one another
3. layer: protective layer Example B 1. layer of nanoparticles made from cobalt (Co), samarium (Sm), iron (Fe) or from alloys which contain one or more of these elements, such as for example iron/cobalt (FeCo)-alloys or cobalt/copper (Co/Cu)-alloys.
2. layer protective layer In a preferred embodiment stacks are formed from several stacks for example several stacks of the 1. and 3. layer according to example A over one another.

In a preferred embodiment a sensor is created with the production method according to the invention which, for sensing a magnetic field, or a change of a magnetic field respectively, uses an XMR-effect (X-magnetoResistive-effect), for example the GMR-effect (giant magneto resistance-effect) or the AMR-effect (Anisotrope Magneto resistive Effect) or the TMR-effect (Tunnel Magneto Resistance-Effect).

In a preferred embodiment, in a sensor which is produced in the production method according to the invention and which uses the GMR effect, magnetic nanoparticles made from a magnetic material ("magnetic nanoparticles", wherein "magnetic nanoparticles" also refers to those which are made from a magnetizable material and after deposition onto the substrate are treated in such a way that they generate a magnetic field themselves) are provided on the substrate as well as nanoparticles made from an electrically conductive material ("conducting nanoparticles"), which are disposed in the interspaces between the magnetic nanoparticles. Such an arrangement of nanoparticles on the substrate can be achieved with the production method according to the invention in that magnetic nanoparticles as well as conducting nanoparticles are contained in a single ink which is deposited to the substrate by means of a printing process. By printing-on of the ink which contains the two particle types, a random arrangement of the magnetic nanoparticles and the conducting nanoparticles on the substrate can occur. It is assumed however, that this random arrangement of magnetic and conducting nanoparticles already has at least a small but usable GMR-effect. For example, an even matrix arrangement can be established by certain coupling points on the ligand covers. As an alternative or in addition, in the production method according to the invention, firstly a first ink can be deposited by means of a printing process, wherein the first ink contains magnetic nanoparticles or at least predominantly contains magnetic nanoparticles and only small proportions of other nanoparticles. Afterwards, a second ink, which contains conducting nanoparticles or at least predominantly contains conducting nanoparticles and only small proportions of other nanoparticles can be deposited. The separate deposition of the magnetic nanoparticles and the conducting nanoparticles in two separate printing processes allows establishing the arrangement of the magnetic nanoparticles relative to the conducting nanoparticles.

In a preferred embodiment, the previously described production of a sensor with a GMR-effect, uses magnetic nanoparticles and conducting nanoparticles, which are surrounded by a cover for example a ligand cover. In a refinement of this embodiment, after simultaneous (one ink) or sequential (two inks) deposition of the magnetic nanoparticles and conducting nanoparticles, the ligand cover can be removed in a further, but also in several, interposed processes, for example by heat action. Also, the solvent can be evaporated before the removal of the ligand cover or simultaneous with the removal of the ligand cover.

After the deposition of the magnetic nanoparticles and conducting nanoparticles and removal of the ligand cover (if the nanoparticles have a cover) the magnetic nanoparticles and the conducting nanoparticles can be stabilized and protected on the substrate. In a preferred embodiment this takes place by deposition of a polymer layer which, for example, can also be printed on. In a preferred embodiment a polymer is here used whose solvent does not detach the nanoparticles.

In a preferred embodiment all steps of the method for the production of a sensor, which uses the GMR-effect, are carried out at temperatures below 400 degrees Celsius. This prevents the magnetic nanoparticles from transitioning from the HCP-phase to the FCC-phase.

In an alternative embodiment a sensor which uses the TMR-effect, is produced with the production method according to the invention. In this production method, magnetic nanoparticles are particularly preferably used, which have an insulating, thin intermediate layer. For example, the intermediate layer is created by targeted oxidation at the border of the nanoparticle. The nanoparticle can then be contacted with the contacts via a conducting nanoparticle, for example a gold nanoparticle.

In a preferred embodiment the ligand cover is removed after deposition of the nanoparticles, particularly preferably by heat input. Preferably, the particle distance between the nanoparticles which have been deposited on the substrate is preserved after removal of the cover. In a preferred embodiment, the ligand cover in the previous described exemplary embodiments is removed by means of a laser. The ligand cover can also be removed by heat input in an oven. In addition, or as an alternative, the ligand cover can be removed through microwave irradiation or for example UV-light irradiation.

In a preferred embodiment, an oxide protection is deposited on the deposited particles for example by printing-on. In a preferred embodiment the oxide protection is a plastic. Particularly preferably, a printable polymer, an organic substance and especially preferably PMMA, polystyrene or PVC is used as oxide protection. In a preferred embodiment, a plastic is used as oxide protection with a solvent which is chemically stable with regard to the magnetic and conducting nanoparticles. In a preferred embodiment a printable oxide protection cures at temperatures of below 400 degrees Celsius.

The electrical component according to the invention has at least two electrical contacts, nanoparticles which are arranged on a substrate and made from an electrically conductive material, from a magnetic material and/or nanoparticles made from a magnetizable material. The nanoparticles are arranged on the substrate in one or more surface areas of the substrate and are arranged on the substrate within the surface areas in a regular shape with a lattice structure, wherein the lattice structure of the nanoparticles extends over the entire respective surface area. The entire respective surface area can be divided geometrically into uniform square partial areas (square pixel) which border each other, or divided geometrically essentially through uniform circular or elliptical partial areas (round pixel) which are arranged next to each other in a matrix. Each square partial area has an edge length of less than 4 millimeter, particularly preferably of less than 1 millimeter and especially preferably of less than 100 micrometers, or each circular or elliptical partial area has a maximal diameter of less than 4 millimeters, particularly preferably of less than 1 millimeter and especially preferably of less than 100 micrometers respectively.

The geometric shape of the surface areas results from the fact that the nanoparticles were generated by printing-on of an ink which contains the nanoparticles and/or nanoparticles which are surrounded by a cover. Surface areas generated in this manner are composed of pixels (geometric partial areas).

The use of square partial areas with an edge length of less than 4 millimeters, particularly preferably of less than 1 millimeter and especially preferably of less than 100 micrometers, or respectively, of circular or elliptical partial areas with a maximal diameter of less than 4 millimeters, particularly preferably of less than 1 millimeter and especially preferably of less than 100 micrometers, allows to generate surface areas which have minimal dimensions and/or complex shapes. This allows to create electrical components in a multitude of shapes and sizes which in turn makes the component versatile.

Particularly preferably, at least one surface area has a geometrical shape, in which at least one square partial area, or only one circular or elliptical partial area, respectively, is arranged adjacent to only one other or only two other square partial areas, or circular or elliptical partial areas, respectively. In a preferred embodiment at least one surface area comprises at least two rows of square or circular or elliptical partial areas, respectively, wherein the number of the partial areas in one row is different from the number of the partial areas in the second row.

In a preferred embodiment, the lattice structure of the nanoparticles comprises a monolayer of nanoparticles, which extends in a horizontal plane. This allows creating a particularly thin electrical component.

In a preferred embodiment the lattice structure of the nanoparticles comprises several horizontal planes which are arranged one above the other. This allows achieving electrical components having particular effects such as the GMR-effect (although the GMR-effect could also be realized with a monolayer). Several layers can also increase the strength of the effects caused by the nanoparticles.

In a preferred embodiment at least one nano particle can be covered by a protective layer.

In a preferred embodiment the electrical component according to the invention is produced by the production method according to the invention.

In a preferred embodiment the electrical component shows an XMR-effect (X-MagnetoResistive-Effect), for example the GMR effect (giant magnetoresistance effect) or the AMR-effect (Anisotrope Magnetoresistive Effect) or the TMR-Effect (Tunnel Magneto Resistance Effect).

In the following, the invention is further explained by way of drawings which merely illustrate exemplary embodiments. It shows:

FIG. 1 a schematic illustration of the disorder-order transition in the evaporation of the solvent of a nanoparticle suspension which contains the nanoparticles which are surrounded by a cover.

Figure 2:
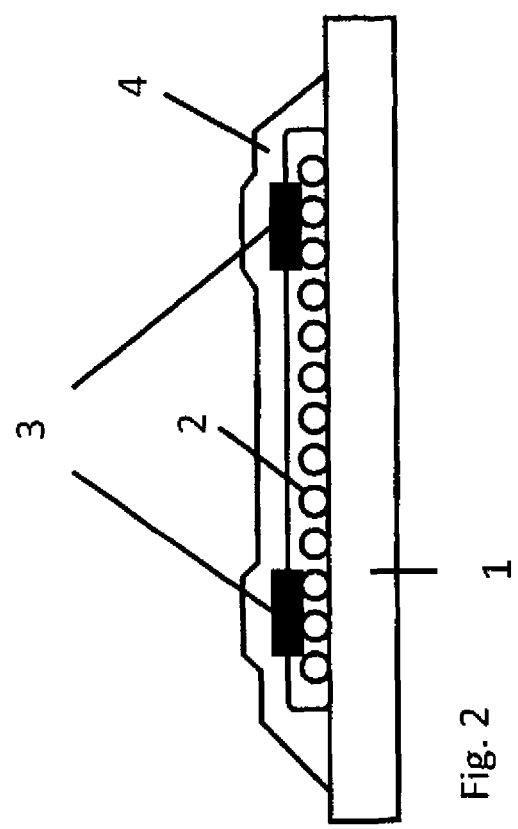
Figure 3:
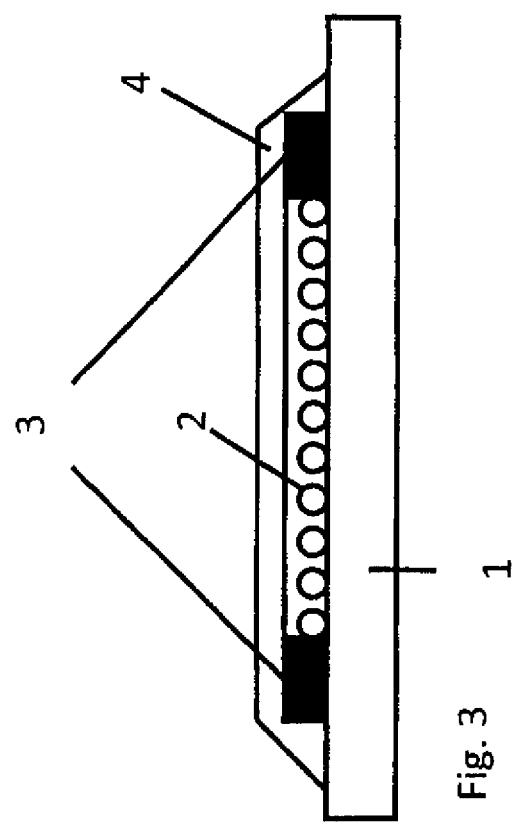
Figure 4:
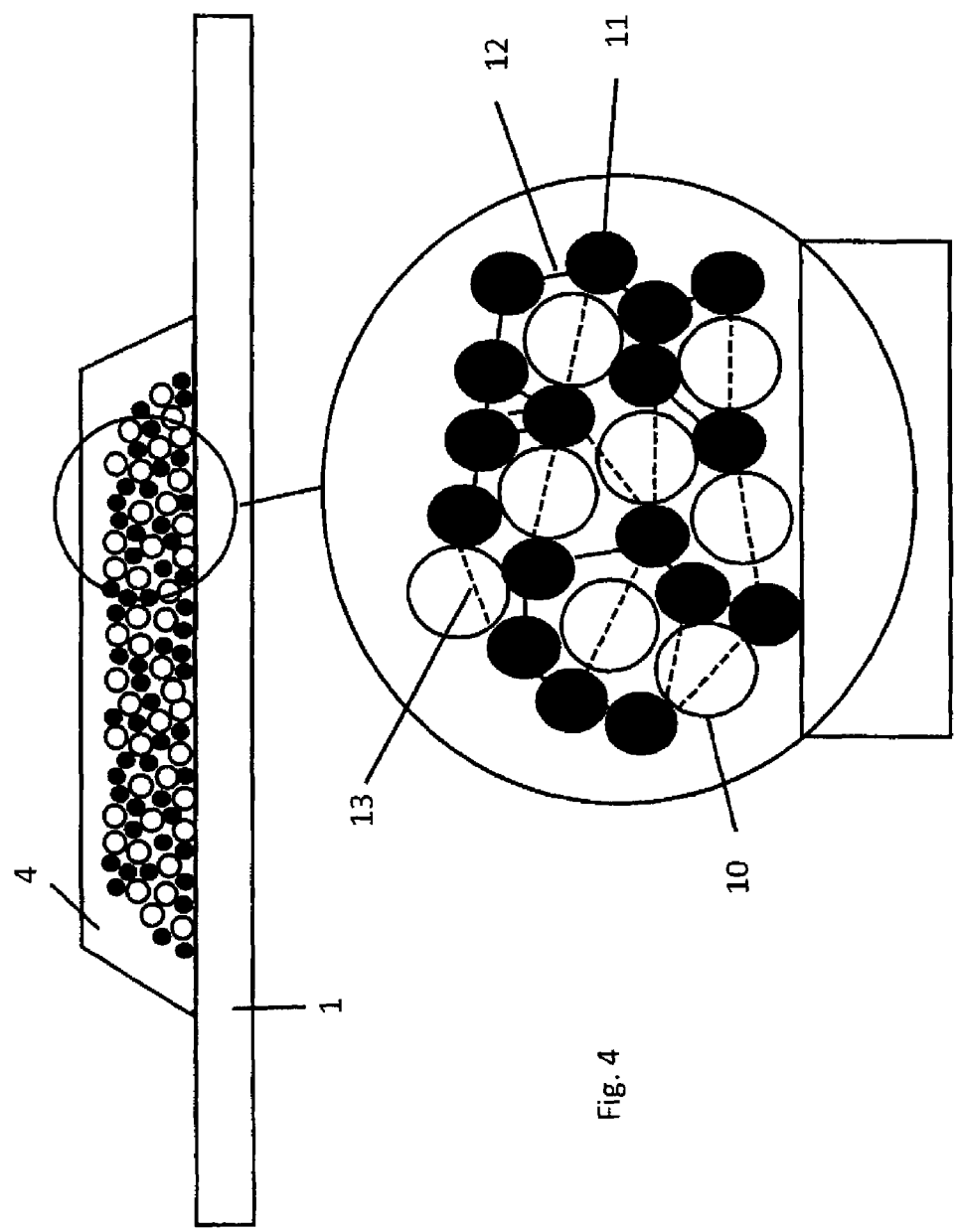
Figure 5:
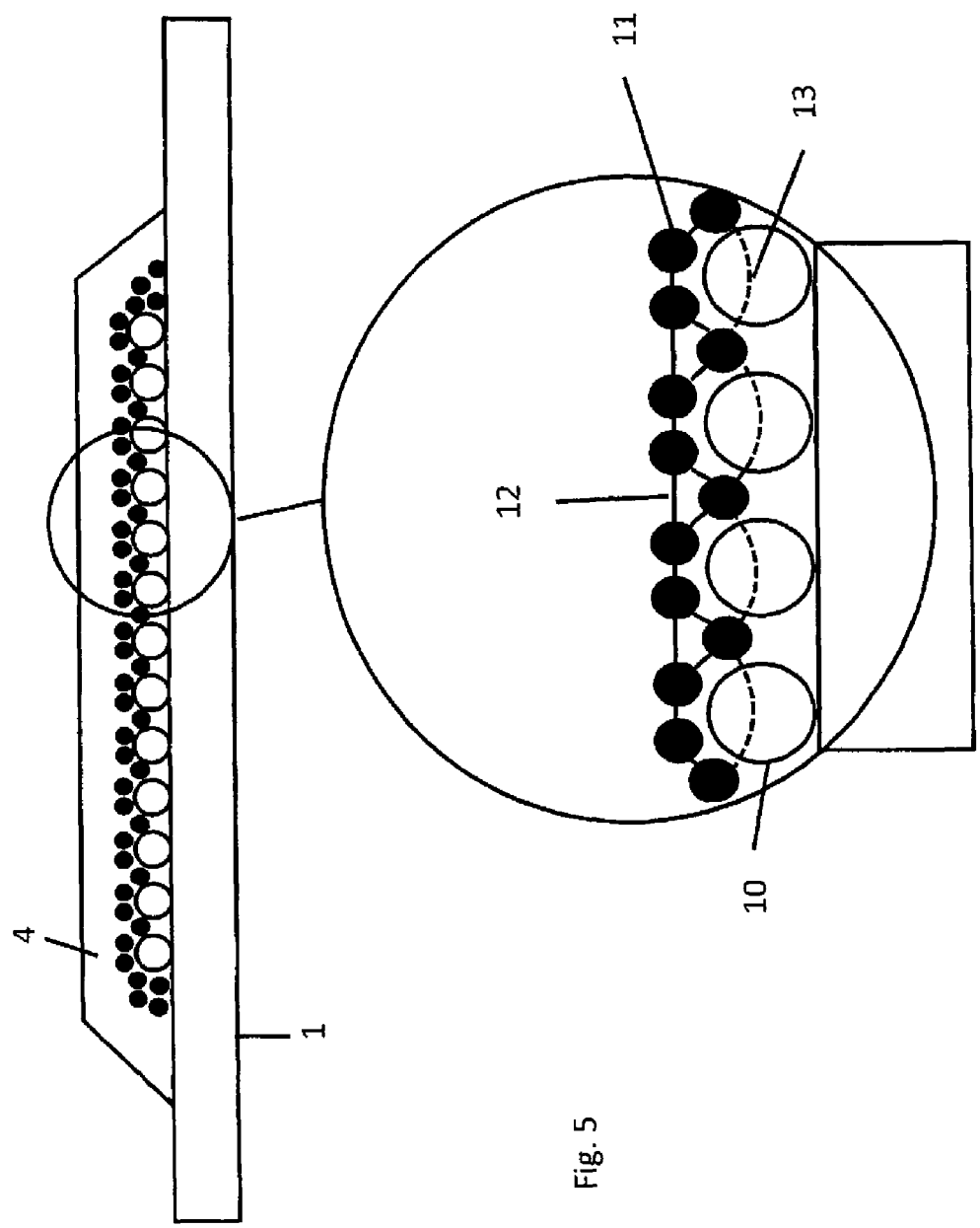
Figure 6:
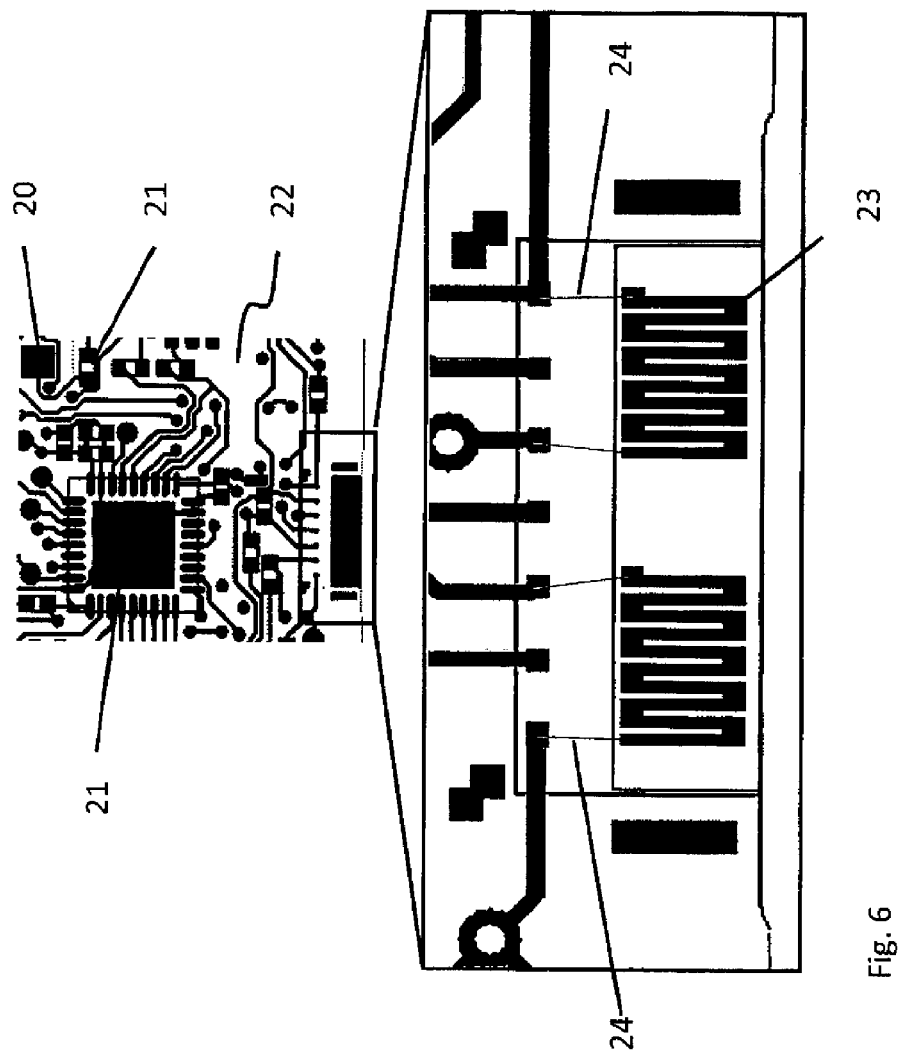
Figure 7:
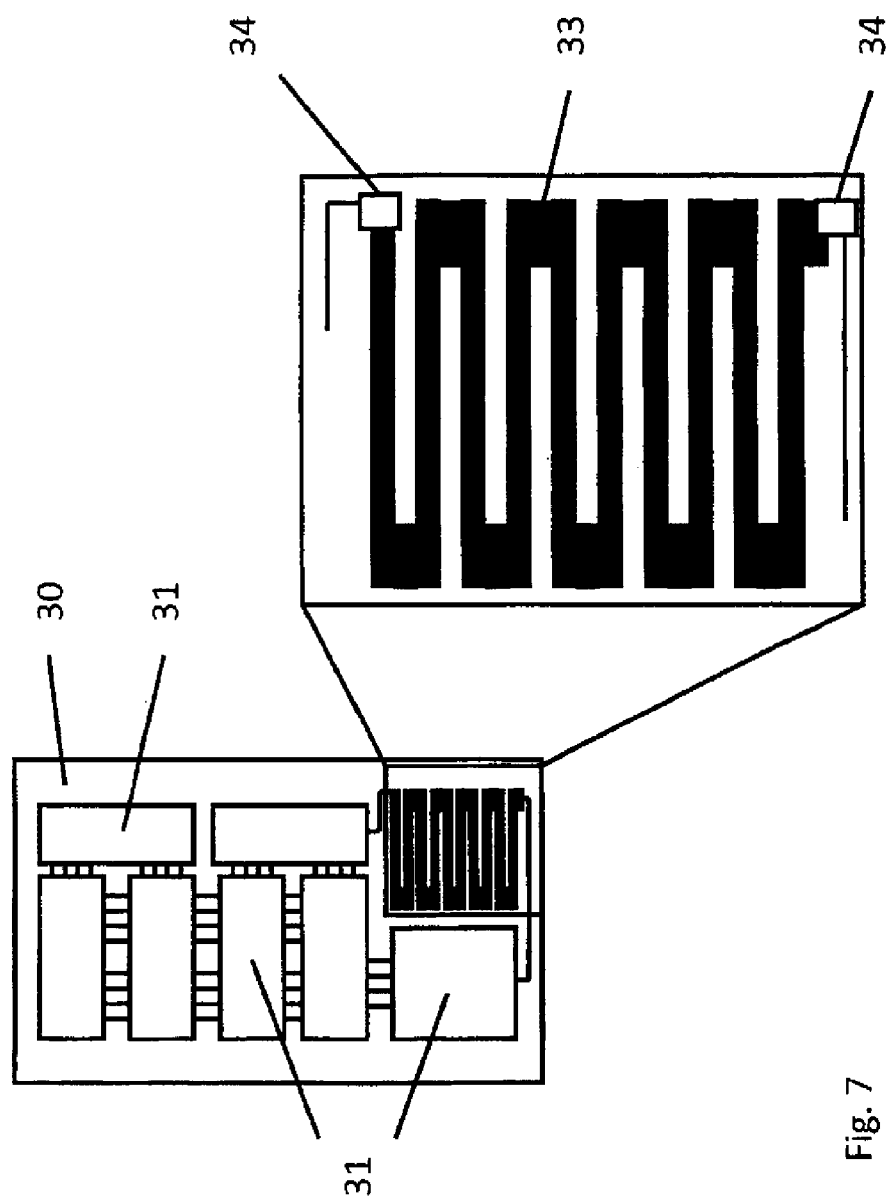
Figure 8:
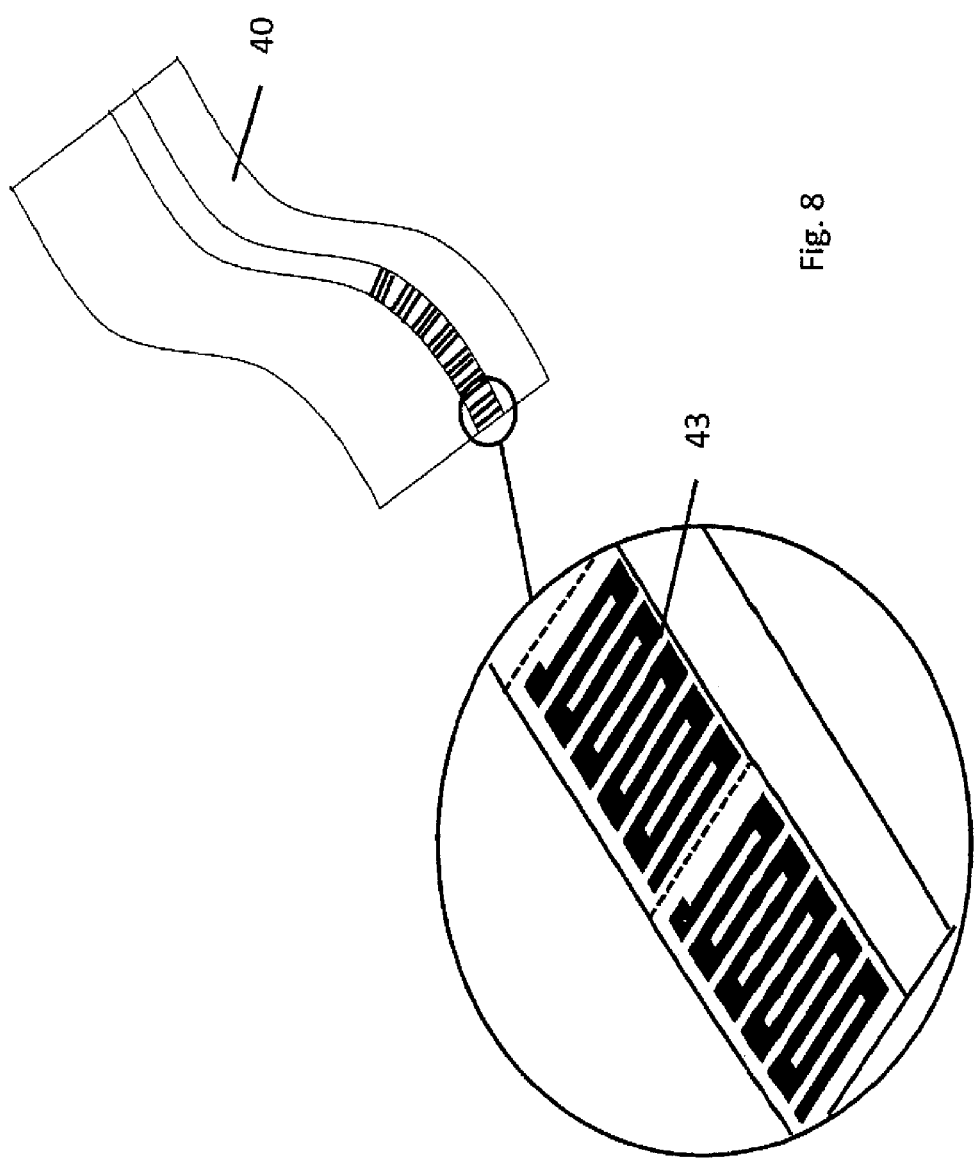
Figure 9:
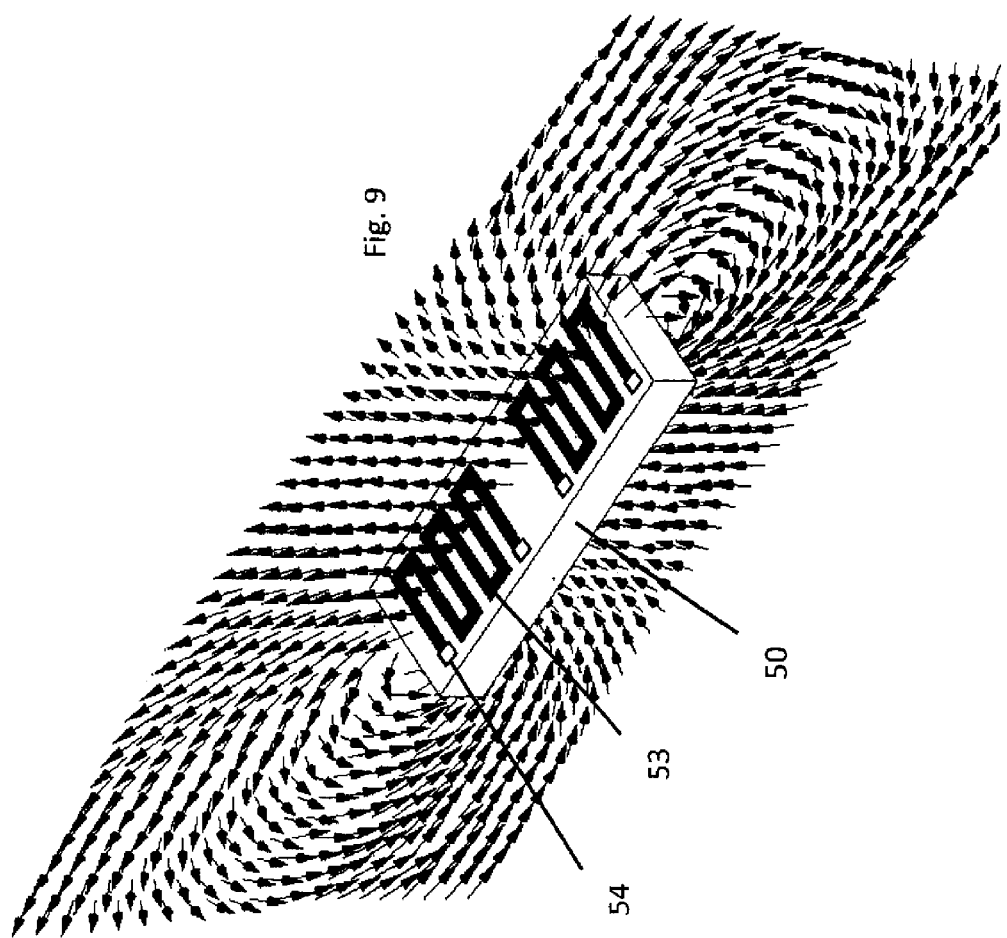
Figure 10:
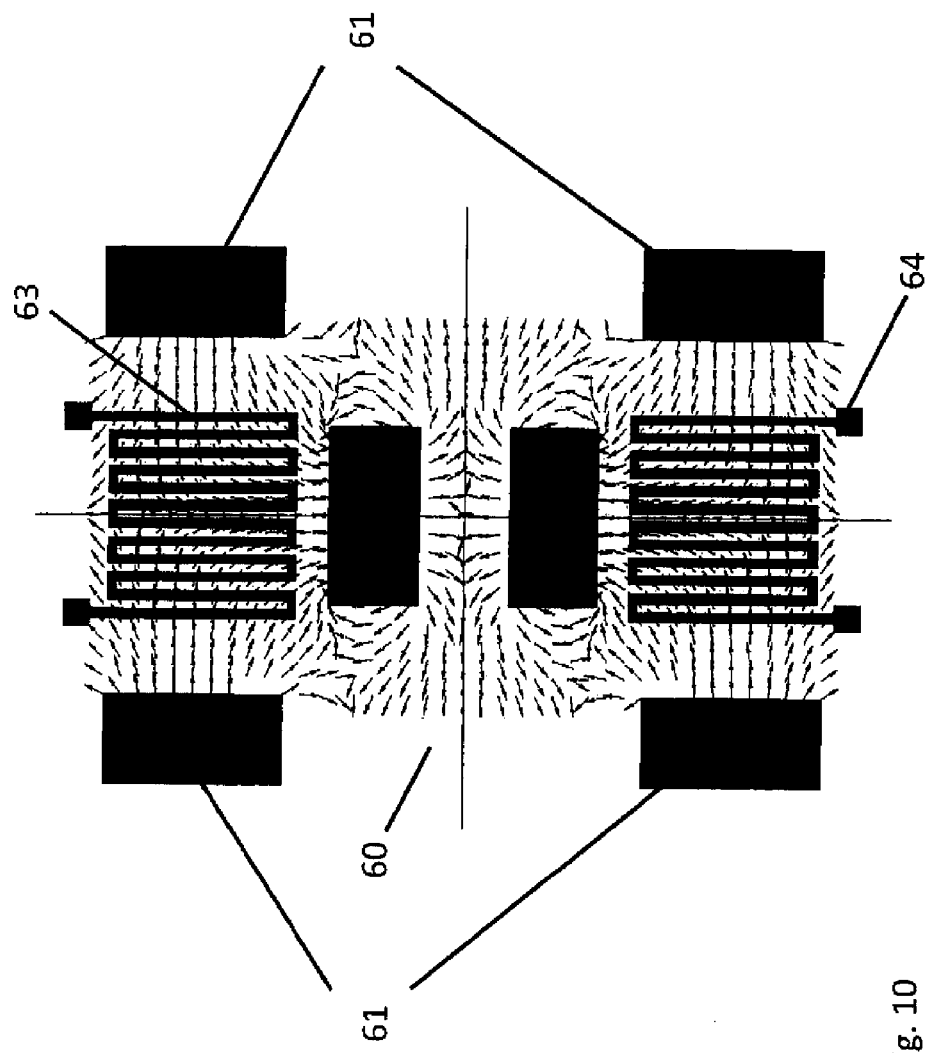
Figure 11:
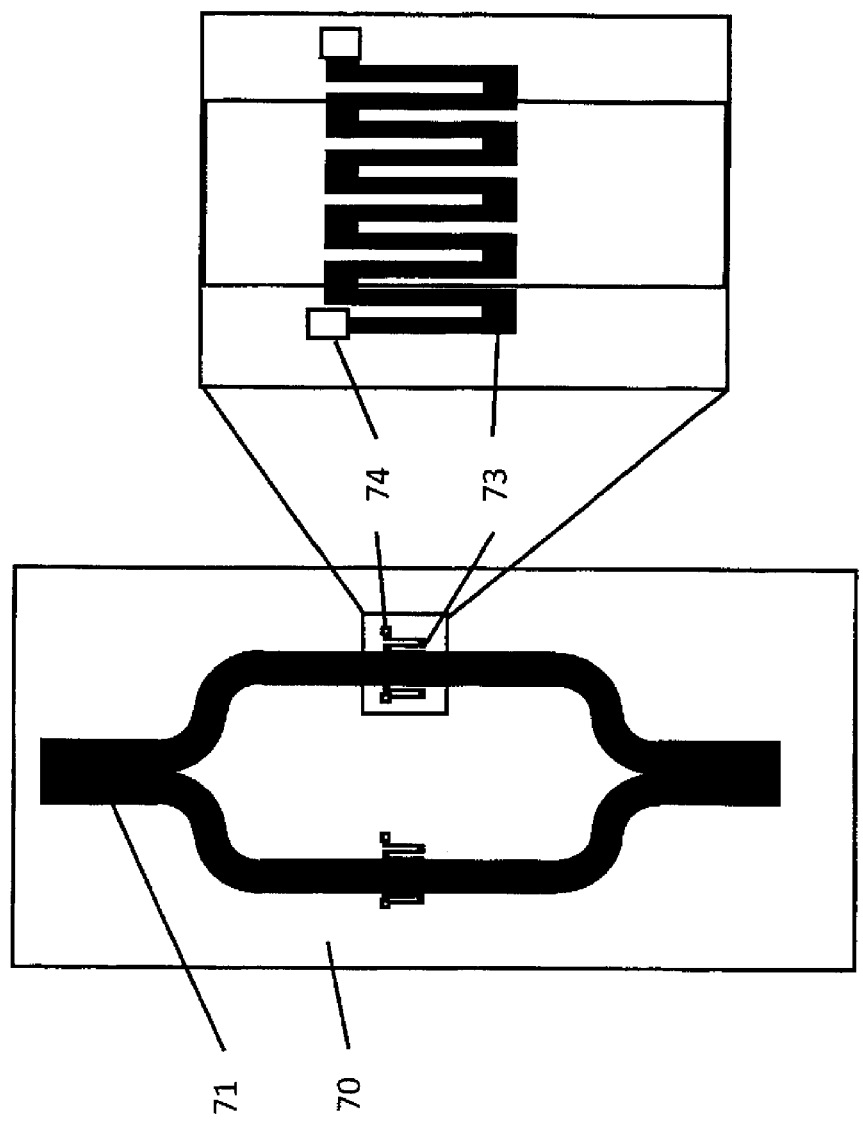

FIG. 2 a schematic representation of an electrical component produced with the production method according to the invention in a first configuration, FIG. 3 a schematic representation of an of an electrical component produced with the production method according to the invention in a second configuration in a partially sectioned side view, FIG. 4 a schematic representation of an electrical component produced with the production method according to the invention in a third configuration in a partially sectioned side view, FIG. 5 a schematic representation of an electrical component produced with the production method according to the invention in a fourth configuration in a partially sectioned side view, FIG. 6 a schematic representation of an electrical component produced with the production method according to the invention in the form of a printed circuit board in a perspective plan view, FIG. 7 a schematic representation of an electrical component produced with the production method according to the invention in the form of an ASIC (Deposition Specific Integrated Circuit), FIG. 8 a schematic representation of an electrical component produced with the production method according to the invention with a foil as substrate in a perspective plan view, FIG. 9 a schematic representation of an electrical component produced with the production method according to the invention with a Bias-magnet as substrate in a perspective plan view, FIG. 10 a schematic representation of an electrical component produced with the production method according to the invention with a printed on Bias-magnet as substrate in a perspective plan view and FIG. 11 a schematic representation of an electrical component produced with the production method according to the invention, which is integrated in a micro fluid system in a perspective plan view.

The schematic representation shown in FIG. 1 is taken from the doctoral thesis of Ms Dr. Inga Ennen (page 10; FIG. 2.5). In the left image of the schematic representation a nanoparticle suspension is shown which is deposited on a carrier. The nanoparticles are surrounded by a ligand cover. The right image of the schematic representation shows how the nanoparticles are arranged on the carrier after evaporation of the solvent of the nano particle suspension. This order process s starts when the volume fraction of the particles exceeds the value φkrit=0.49.

The nanoparticle suspension shown in the schematic representation which, according to the doctoral thesis of Ms Dr. Inga Ennen is deposited by spin coating or dipping, in the production method according to the invention is deposited on a substrate as an ink which contains nanoparticles and/or nanoparticles which are surrounded by a cover, by means of a printing process.

FIGS. 2 and 3 show embodiments of electrical components produced with the production method according to the invention. The electrical component has a substrate 1, on which a single layer of nanoparticles 2 has been deposited. The nanoparticles 2 can be made from an electrically conductive material, from a magnetic material and/or from a magnetizable material. FIG. 2 shows an electrical contacting 3 with two electrical contacts, which has been deposited on top of the layer of nanoparticles. In FIG. 3 the electrical contacting 3 is deposited with two electrical contacts adjacent to the layer of nanoparticles. FIGS. 2 and 3 show a protective layer 4 which has been deposited over the nanoparticles and the contacting 3.

In the embodiment shown in FIG. 4 the electrical component has a substrate, on which a granular network of nanoparticles 10, 11 has been deposited. The nanoparticles 10 are magnetic nanoparticles, which are made from magnetic material. The nanoparticles 11 are made from an electrically conductive material. It can be seen that the nanoparticles 11 form a direct conducting path 12, since individual electrically conductive materials contact each other. Further, an XMR-sensitive conducting path 13 through the magnetic nanoparticles 10 can be seen. The electrical component shown in FIG. 4 has a protective layer 4. Contacts (not shown) are provided which contact at least one electrically conductive nano particle 11.

In the embodiment shown in FIG. 5 the electrical component has a substrate 1, onto which a two layered layer of nanoparticles 10, 11 has been deposited by means of the production method according to the invention. The nanoparticles 10 are magnetic nanoparticles, which are made from magnetic material. The nanoparticles 11 are made from an electrically conductive material. It can be seen that the nanoparticles 11 form a direct conducting path 12, since individual electrically conductive materials contact each other. Further, an XMR-sensitive conducting path 13 through the magnetic nanoparticles 10 can be seen. The electrical component shown in FIG. 4 has a protective layer 4. Contacts (not shown) are provided, which contact at least one electrically conductive nanoparticle 11.

FIG. 6 shows that the electrical component produced with the production method according to the invention can also be configured as printed circuit board (PCB; circuit board). On the one hand, the circuit board 20 forms a carrier for components 21, which are connected to each other via electric lines, for example conducting connections (conducting tracks) which adhere to the carrier plate (substrate) 22. On the other hand, nanoparticles are directly printed onto the substrate 22 of the circuit board 20, which form the meandering structures 23 shown in the enlargement in FIG. 6. Provided at the ends of the meandering structures are contacts 24 by which the structure, which is formed by the printed-on nanoparticles, is connected with the other components 21 of the circuit board 20. The meandering structure 23 is configured, and the nanoparticles are chosen, such that the component shows an XMR-effect (X-MagnetoResistive-effect) for example the GMR-effect (giant magneto resistance effect) or the AMR-effect (Anisotrope Magnetoresistive effect) or the TMR-effect (Tunnel Magneto Resistance-effect).

FIG. 7 shows that the electrical component produced with the production method according to the invention can also be configured as an ASCI (Deposition Specific Integrated Circuit). On the one hand, a substrate 30 forms a carrier for components 31, which are connected to each other via electric lines, for example conducting connections (conducting tracks) which adhere to the carrier plate (substrate) 22. On the other hand, nanoparticles are directly printed onto the substrate 30 of the circuit board 20, which form the meandering structures 33 shown in the enlargement in FIG. 7. Provided at the ends of the meandering structures 33 are contacts 34 with which the structure 33, which is formed by the printed-on nanoparticles, is connected to the other components 31. The meandering structure 33 is configured, and the nanoparticles are chosen, such that the component shows an XMR-effect (X-MagnetoResistive-effect) for example the GMR-effect (giant magneto resistance effect) or the AMR-effect (Anisotrope Magnetoresistive effect) or the TMR-effect (Tunnel Magneto Resistance-effect).

FIG. 8 shows that the electrical component produced with the production method according to the invention can also have a foil 40 as substrate. Nanoparticles, which form the meandering structures 43 shown in the enlargement of FIG. 8, are directly printed onto the foil 40. The meandering structure 43 is configured, and the nanoparticles are chosen, such that the component shows an XMR-effect (X-MagnetoResistive-effect) for example the GMR-effect (giant magneto resistance effect) or the AMR-effect (Anisotrope Magnetoresistive effect) or the TMR-effect (Tunnel Magneto Resistance-effect. FIG. 8 shows dotted dividing lines along which the foil can be cut to produce individual sensors (electrical components).

FIG. 9 shows that the electrical component produced with the production method according to the invention can also have a bias-magnet 50 as substrate. Nanoparticles, which form the meandering structures 53 shown in the enlargement of FIG. 9, are directly printed onto the substrate 50. The meandering structure 53 is configured, and the nanoparticles are chosen, such that the component shows an XMR-effect (X-MagnetoResistive-effect) for example the GMR-effect (giant magneto resistance effect) or the AMR-effect (Anisotrope Magnetoresistive effect) or the TMR-effect (Tunnel Magneto Resistance-effect. Provided at the ends of the meandering structures 53 are contacts 54.

FIG. 10 shows that the electrical component produced with the production method according to the invention can also be configured with Bias-magnets 61 which are printed onto the substrate 60. Nanoparticles, which form the meandering structures 63 are directly printed onto the substrate 60. The meandering structure 63 is configured, and the nanoparticles are chosen, such that the component shows an XMR-effect (X-MagnetoResistive-effect) for example the GMR-effect (giant magneto resistance effect) or the AMR-effect (Anisotrope Magnetoresistive effect) or the TMR-effect (Tunnel Magneto Resistance-effect. Provided at the ends of the meandering structures 63 are contacts 64.

FIG. 11 shows a micro fluid system. On a substrate 70, channels 71 are formed though which a fluid can pass. Nanoparticles, which form the meandering structures 73 are directly printed onto the substrate 70. The meandering structure 73 is configured, and the nanoparticles are chosen, such that the component shows an XMR-effect (X-MagnetoResistive-effect) for example the GMR-effect (giant magneto resistance effect) or the AMR-effect (Anisotrope Magnetoresistive effect) or the TMR-effect (Tunnel Magneto Resistance-effect. Provided at the ends of the meandering structures 73 are contacts 74.

What is claimed is:

1. A method for producing an electrical component having at least two electrical contacts, comprising applying an ink that at least partially overlaps the at least two electrical contacts, the ink containing nanoparticles made by from a material selected from the group consisting of an electrically conductive material, a magnetic material, and a magnetizable material, onto a substrate by using a printing process, wherein at least some of said nanoparticles are surrounded by a cover, said cover comprising a ligand cover.

2. The method of claim 1, wherein the nanoparticles are substantially spherical.

3. The method of claim 1, wherein the nanoparticles have substantially the same diameter and a standard deviation of a distribution of a diameter of the nanoparticles is smaller than 10%.

4. The method of claim 1, wherein the nanoparticles have substantially the same diameter and a standard deviation of a distribution of a diameter of the nanoparticles is smaller than 5%.

5. The method of claim 1, further comprising making the nanoparticles by generating nuclei through reduction of metal salts or a decomposition of metal organic compounds in a solvent, growing the nuclei, and ripening the nuclei in an Ostwald-ripening process.

6. The method of claim 5, further comprising stabilizing the nanoparticles after the Ostwald-ripening process.

7. The method of claim 1, wherein the ink comprises a solvent in which the nanoparticles are dissolved, and further comprising evaporating the solvent after applying the ink onto the substrate.

8. The method of claim 1, wherein the nanoparticles occupy a volume proportion of more than 49% of the total volume of the ink.

9. The method of claim 1, further comprising depositing an electrically conductive material to connect at least one of the nanoparticles to one of the electrical contacts.

10. The method of claim 1, further comprising removing the cover after applying the ink onto the substrate.

11. The method of claim 1, further comprising the step of applying a protective layer on at least one of the nanoparticles after applying the ink containing the nanoparticles onto the substrate.

12. The method of claim 1, further comprising producing a sensor showing a X-magneto resistive effect.

13. The method of claim 12, wherein the X-magneto resistive effect is a GMR effect (Giant Magnetoresistance effect) or an AMR effect (Anisotrope Magnetoresistive effect), or a TMR effect (Tunnel Magneto Resistance effect).

\* \* \* \* \*